United States Patent
Chen et al.

(10) Patent No.: US 8,058,136 B2
(45) Date of Patent: Nov. 15, 2011

(54) SELF-ALIGNMENT METHOD FOR RECESS CHANNEL DYNAMIC RANDOM ACCESS MEMORY

(75) Inventors: Chien-Hsun Chen, Taoyuan County (TW); Tzung Han Lee, Taipei (TW); Chung-Lin Huang, Taoyuan County (TW)

(73) Assignee: Inotera Memories, Inc., Taoyuan County (TW)

( * ) Notice: Subject to any disclaimer, the term of this patent is extended or adjusted under 35 U.S.C. 154(b) by 1 day.

(21) Appl. No.: 12/827,082

(22) Filed: Jun. 30, 2010

(65) Prior Publication Data

US 2011/0053337 A1     Mar. 3, 2011

(30) Foreign Application Priority Data

Aug. 28, 2009   (TW) .............................. 98128972 A

(51) Int. Cl.
*H01L 21/76*     (2006.01)
(52) U.S. Cl. ........ 438/401; 438/412; 438/424; 438/427; 438/421; 257/506; 257/510; 257/522
(58) Field of Classification Search ........ 438/FOR. 208, 438/FOR. 212, FOR. 189, 400, 401, 405, 438/412, 421, 422, 423, 424, 425, 426, 427, 438/433, 434, 435; 257/499, 353, 410, 509, 257/501, 506, 510, 513, 519, 520, 522, 544
See application file for complete search history.

(56) References Cited

U.S. PATENT DOCUMENTS

| | | | | |
|---|---|---|---|---|
| 2005/0221580 A1* | 10/2005 | Saitou et al. | ... | 438/435 |
| 2005/0239257 A1* | 10/2005 | Sato et al. | ... | 438/296 |
| 2006/0273388 A1* | 12/2006 | Yamazaki | ... | 257/330 |
| 2007/0114631 A1* | 5/2007 | Sato et al. | ... | 257/506 |
| 2007/0170522 A1* | 7/2007 | Lee et al. | ... | 257/401 |

* cited by examiner

*Primary Examiner* — Ha Tran T Nguyen
*Assistant Examiner* — Thanh Y Tran
(74) *Attorney, Agent, or Firm* — Rosenberg, Klein & Lee

(57) ABSTRACT

A self-alignment method for a recess channel dynamic random access memory includes providing a substrate with a target layer, a barrier layer and a lining layer, wherein the target layer has shallow trench isolation structures; patternizing the lining layer, barrier layer and target layer to form recess trench channels; depositing a dielectric layer onto the recess trench channel; forming an ion doped region in the target layer; removing a portion of the dielectric layer to expose a portion of the recess trench channel; forming a filler layer covered onto the recess trench channel; removing a portion of the filler layer to expose a portion of the recess trench channel; forming a passivation layer onto the recess trench channel; removing the passivation layer on the lining layer; and removing the lining layer to form a plurality of structural monomers disposed at the recess trench channel and protruded from the target layer.

20 Claims, 8 Drawing Sheets

SELF-ALIGNMENT METHOD FOR RECESS CHANNEL DYNAMIC RANDOM ACCESS MEMORY

BACKGROUND OF THE INVENTION

1. Field of the Invention

The present invention relates to a self-alignment method applied in the field of semiconductors, in particular, to a self-alignment method for a recess channel dynamic random access memory capable of overcoming a mis-aligned problem after an exposure alignment takes place.

2. Description of Related Art

At present, optical lithography of semiconductor fabrication technology still has a size limitation to a certain extent, and the wire width cannot be reduced further due to the physical limitations of optics, so that it is difficult to enhance the resolution of pattern-transfer method. Furthermore, the smaller the size of an electronic device is, the more difficult the control of an overlay precision of a yellow light lithography is. Meanwhile, other lithographic technologies such as E-beam lithography and extreme ultraviolet (EUV) lithography also encounter bottlenecks of actual throughput, material research and development of related apparatuses.

With reference to FIGS. 1A to 1C for schematic views of a self-alignment method for a dynamic random access memory, the self-alignment method comprises the steps of:

forming a target layer 2a including a plurality of shallow trench isolation structures 11a and a plurality of recess trench channels 12a on a surface of a substrate 1a, wherein the shallow trench isolation structure 11a is disposed between the recess trench channels 12a;

depositing a plurality of dielectric layers 3a on the target layer 2a, such that the dielectric layer 3a is formed and covered onto surfaces of the target layer 2a and the shallow trench isolation structure 11a, and the dielectric layer 3a covers and is filled into the recess trench channel 12a;

After the dielectric layer 3a is formed, selectively performing an ion-implant process to a portion of the target layer 2a according to an electronic circuit design to form an ion-implant region 13a; and using an exposure alignment method to selectively remove a portion of the dielectric layer 3a, and more specifically, the exposure alignment method patternizes the dielectric layer 3a by an optical lithography process and an etching process to form a plurality of structural monomers 14a protruded from the recess trench channel 12a in the target layer 2a.

However, the foregoing method has the following drawbacks: When the exposure alignment method is carried out, it is difficult to control the overlay precision in the present process, so that a mis-aligned problem occurs after the etching process takes place, and a cell-to-cell field leakage is resulted.

In view of the aforementioned shortcomings of the prior art, the inventor of the present invention provided a reasonable design to overcome the shortcomings of the prior art.

SUMMARY OF THE INVENTION

A primary objective of the present invention is to provide a self-alignment method for a recess channel dynamic random access memory, and the method is applied to a fabrication process of a stack dynamic random access memory, and the self-alignment method can avoid the mis-aligned problem after an exposure alignment takes place in the fabrication process, so as to improve the yield rate of the process.

Another objective of the present invention is to provide a self-alignment method for a recess channel dynamic random access memory, and the self-alignment method can improve the integration density of an integrated circuit product effectively.

To achieve the foregoing objective, the present invention provides a self-alignment method for a recess channel dynamic random access memory, wherein the self-alignment method is applied to a fabrication process of a stack dynamic random access memory, and the self-alignment method comprises the steps of: providing a substrate, wherein the substrate includes a target layer having a plurality of shallow trench isolation structures, a barrier layer and a lining layer sequentially formed on a surface of the substrate; patternizing the lining layer, the barrier layer and the target layer to form a plurality of recess trench channels penetrated through the lining layer and the barrier layer and extended into the target layer; forming a dielectric layer to cover and fill the recess trench channel; selectively forming an ion doped region onto the target layer; removing a portion of the dielectric layer to expose a portion of the recess trench channel; stacking a plurality of types of filling materials to form a filler layer to cover and fill the recess trench channel; removing a portion of the filler layer to expose a portion of the recess trench channel; forming a passivation layer to cover and fill the recess trench channel; removing the passivation layer formed on a surface of the lining layer; and removing the lining layer, and self-aligning a position corresponding to the recess trench channel to form a plurality of structural monomers disposed on and protruded from the target layer.

The objectives, technical measures and advantages of the present invention will become apparent with the detailed description of preferred embodiments and the accompanying drawings as follows.

DETAILED DESCRIPTION OF THE PREFERRED EMBODIMENTS

Figure 1A:
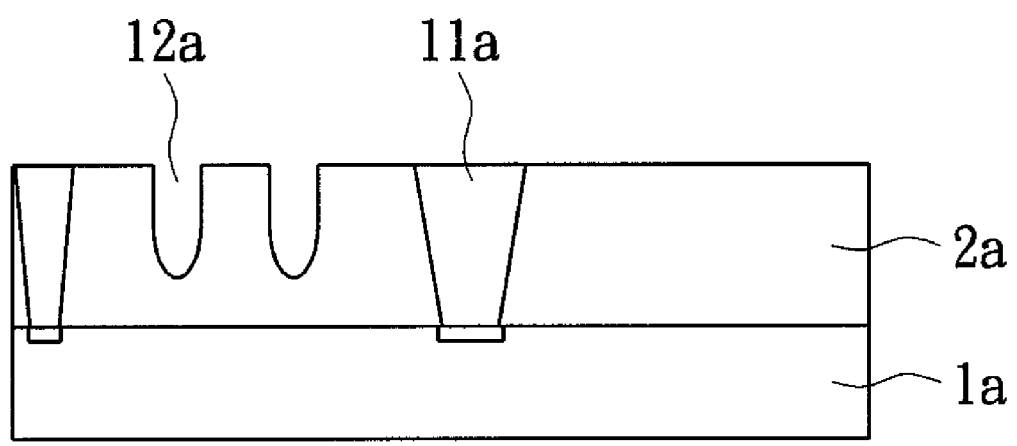
FIGS. 1A to 1C are schematic views of a conventional self-alignment method for a dynamic random access memory.
Figure 1B:
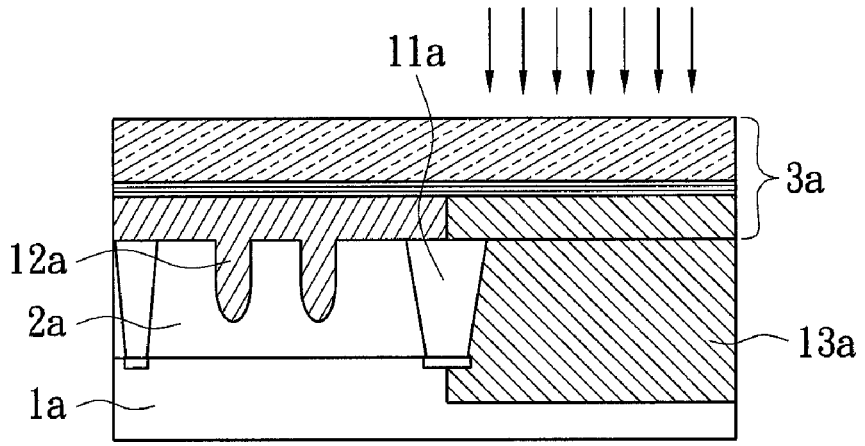
Figure 1C:
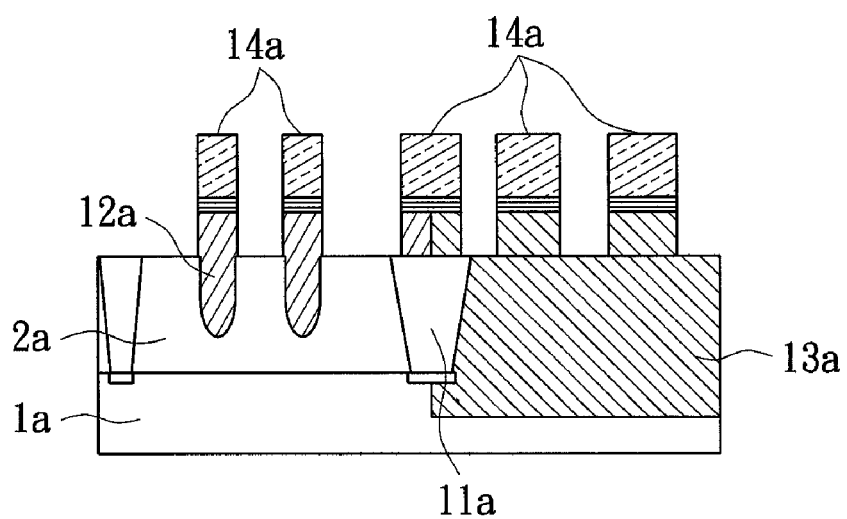
Figure 2:
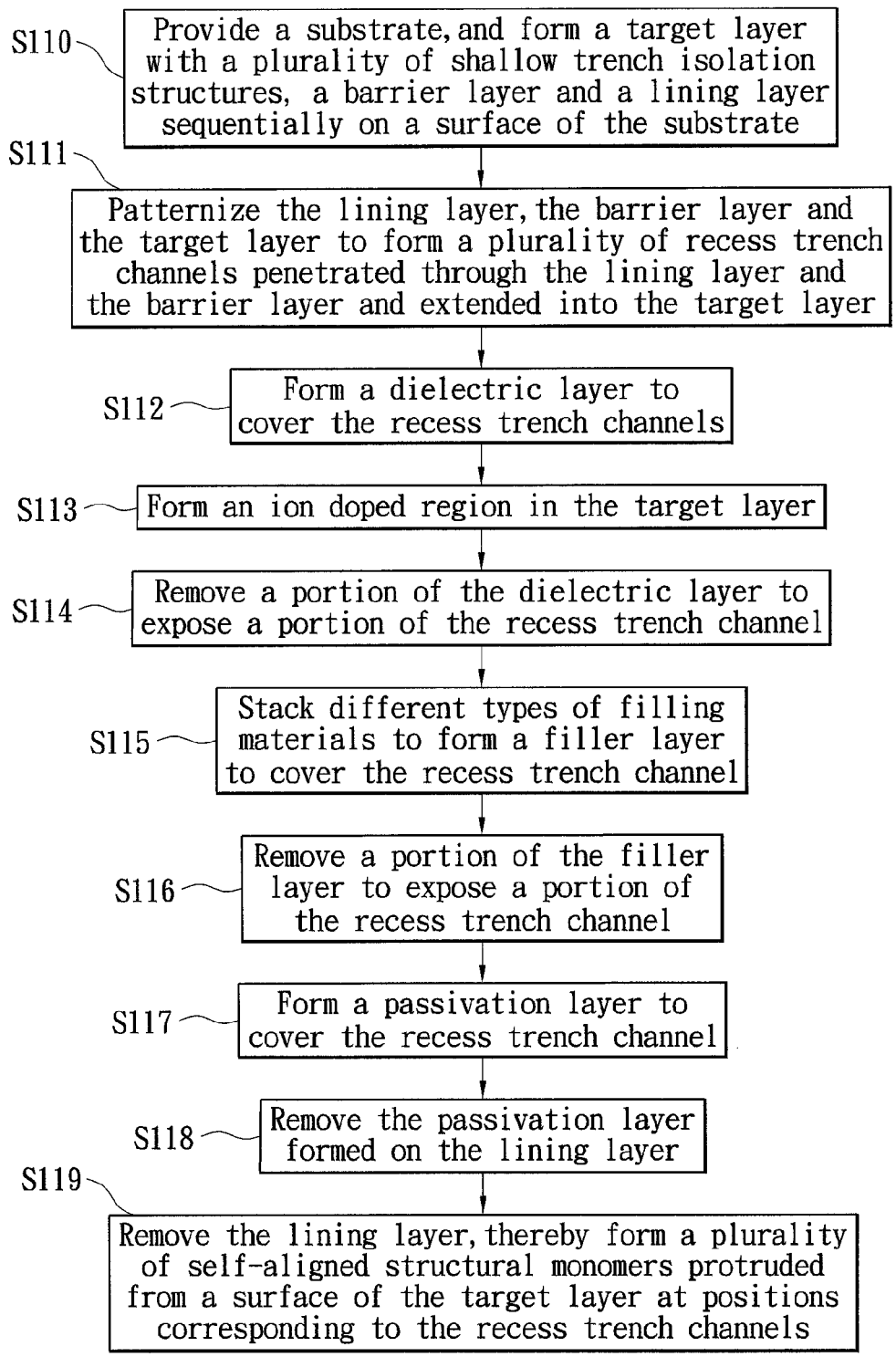
FIG. 2 is a flow chart of a self-alignment method for a recess channel dynamic random access memory in accordance with the present invention.

With reference to FIGS. 2 and 3A to 3J, a self-alignment method for a recess channel dynamic random access memory in accordance with the present invention, the self-alignment method is applied to a fabrication process of a stack dynamic random access memory and uses a way of fabricating a recess trench channel to form the recess trench channel as a specific position, and then the recess trench channel is filled semiconductor materials sequentially, so that it is not necessary to use optical lithography for the alignment, so as to overcome the mis-aligned problem occurred after a conventional exposure alignment takes place. In addition, the self-alignment method includes simple steps and has an effect of improving the yield rate. The self-alignment method of the present invention comprises the following steps:

In Step (S110), a substrate 10 is provided, and a target layer 12, a barrier layer 14 and a lining layer 16 are stacked sequentially on a surface of the substrate 10, wherein the substrate 10 is composed of a material selected from the group consisting of silicon, gallium arsenide, gallium nitride, strained silicon, silicon germanium, silicon carbide, diamond, epitaxial layer, or another material. The target layer 12, the barrier layer 14 and the lining layer 16 are patternized by an optical lithography process and an etching process, wherein the target layer 12 is processed by a shallow trench isolation fabrication process first, and then a plurality of shallow trench isolation structures 122 are formed in the target layer 12. Since the aforementioned shallow trench isolation fabrication process is a prior art in the semiconductor fabrication field, the detailed procedures of the process will not be described here.

It is noteworthy to point out that the lining layer 16 is formed on a surface of the target layer 12 by a thin film deposition process, wherein the thin film deposition process is a physical vapor deposition (PVD) process or a chemical vapor deposition CVD) process, and the lining layer 16 is composed of an oxide material.

Figure 3A:
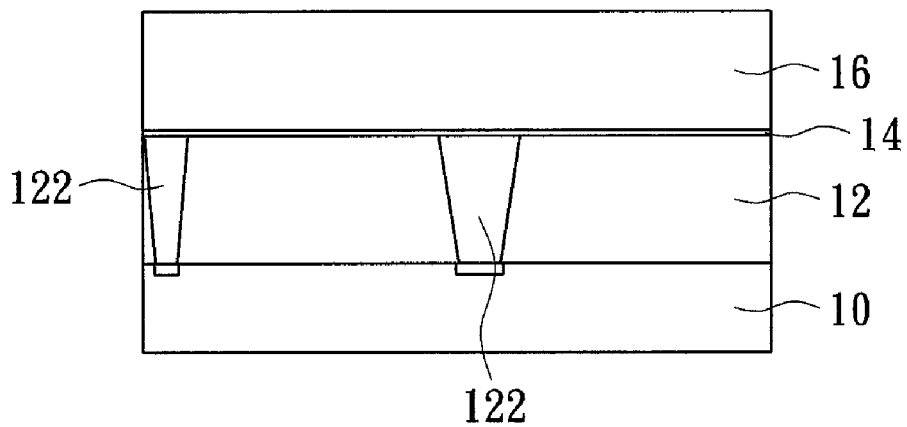
FIGS. 3A to 3J are schematic views of a fabrication flow of a self-alignment method for a recess channel dynamic random access memory in accordance with the present invention.
Figure 3B:
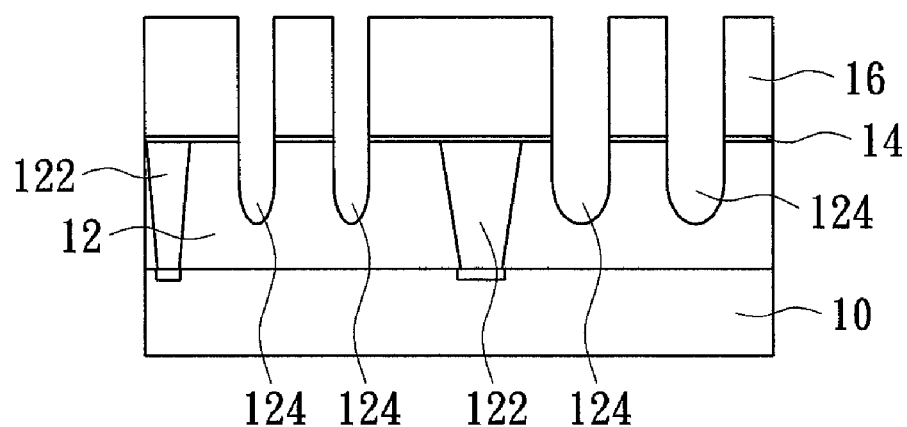

In Step (S111), after the target layer 12 with the shallow trench isolation structure 122, the barrier layer 14 and the lining layer 16 are formed and stacked sequentially on a surface of the substrate 10, a portion of the lining layer 16, a portion of the barrier layer 14 and a portion of the target layer 12 are patternized by an optical lithography process and an etching process to form a plurality of recess trench channels 124, wherein the recess trench channels 124 are penetrated through the lining layer 16 and the barrier layer 14 and extended into the target layer 12 (as shown in FIG. 3B), and the recess trench channels 124 are disposed between the shallow trench isolation structures 122.

Figure 3C:
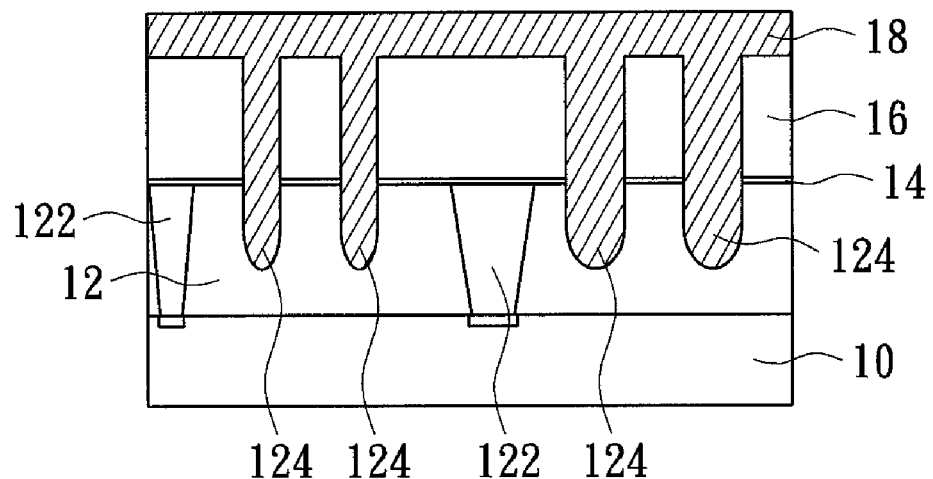

In Step (S112), a dielectric layer 18 is covered onto a surface of the lining layer 16, wherein the dielectric layer 18 is formed onto the lining layer 16 by a thin film deposition process, and the deposited dielectric layer 18 covers and fills up the recess trench channel 124 (as shown in FIG. 3C), and the thin film deposition process can be a PVD process or a CVD process, and the dielectric layer 18 is composed of a poly-silicon material.

In Step (S113), an ion implantation process is performed selectively to a portion of the target layer 12 according to the electronic circuit design requirements, so that ions are penetrated through the dielectric layer 18, the lining layer 16 and the barrier layer 14, and implanted into the target layer 12 to form an ion doped region 126, wherein the ion doped region 126 can be defined as a p-well region or an n-well region according to the implanted ions. It is noteworthy to point out that the implanted ion is zinc ion ($Zn^{2+}$), fluorine ion ($F^-$), nitrogen ion ($N^-$), oxygen ion ($O^{2-}$), carbon ion ($C^{4+}$), argon ion ($Ar^+$), boron ion ($B^+$), phosphorus ion ($P^+$), arsenic ion ($As^+$) or antimony ion ($Sb^+$).

Figure 3D:
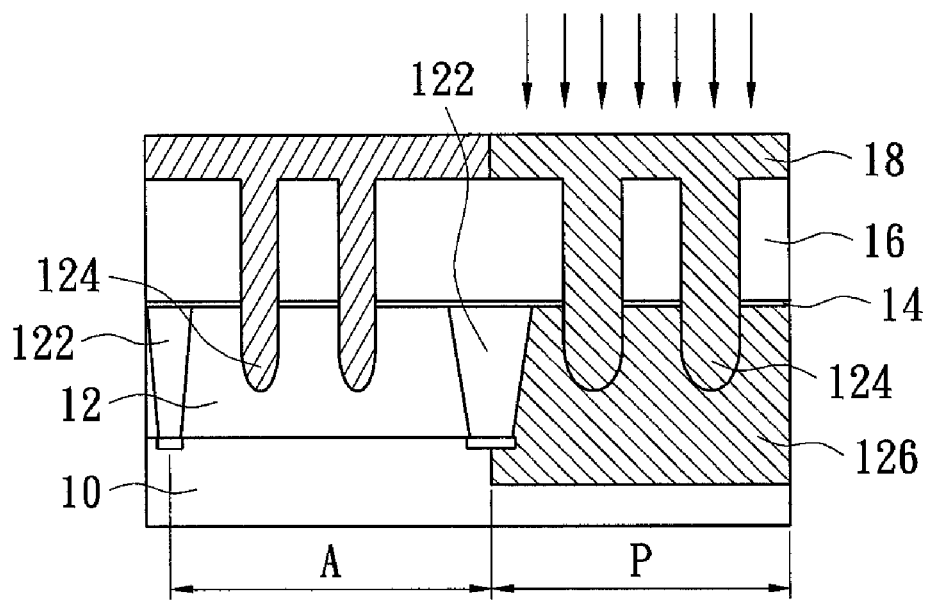

It is noteworthy to point out that the target layer 12 has been processed by the ion-implant process, and thus the target layer 12 is divided into an array region A and a peripheral region P as shown in FIG. 3D.

In Step (S114), after the ion doped region 126 is formed, a portion of the dielectric layer 18 is removed, and more specifically, the dielectric layer 18 formed on a surface of the lining layer 16 is removed by a chemical mechanical polishing (CMP) process.

Figure 3E:
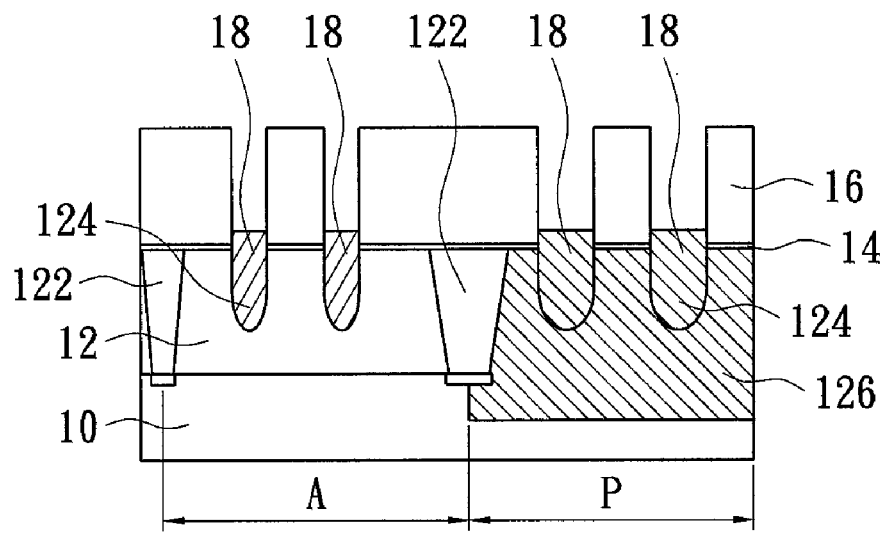

Immediately after the above step, an etch back process is used to remove a portion of the dielectric layer 18 in the recess trench channel 124 to expose a portion of the recess trench channel 124. In other words, a portion of the dielectric layer 18 is still remained in the recess trench channel 124 (as shown in FIG. 3E).

Figure 3F:
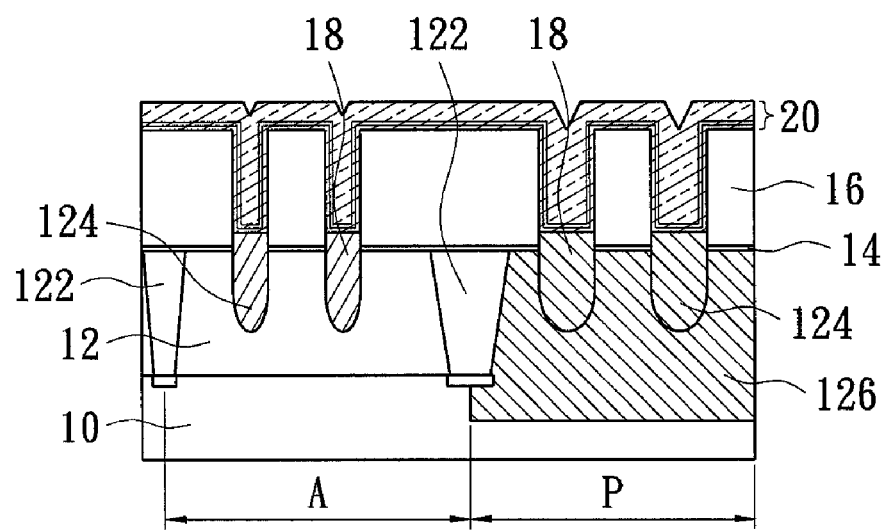

In Step (S115), a filler layer 20 is formed and covered onto a surface of the lining layer 16, wherein the filler layer 20 is formed onto a surface of the lining layer 16 by a thin film deposition process, and the deposited filler layer 20 covers and fills up the recess trench channel 124 (as shown in FIG. 3F).

Further, the filler layer 20 is formed by stacking different types of filling materials sequentially one on top of the other, wherein the number of filler layers is not limited to any particular number, but is determined according to the actual fabrication design and requirements. In this embodiment, at least three types of filling materials are deposited to form the filler layer 20, and these filling materials are titanium (Ti), tungsten nitride (WN) and tungsten (W).

It is noteworthy to mention that the thin film deposition process is a physical vapor deposition (PVD) process or a chemical vapor deposition (CVD) process.

In Step (S116), a portion of the filler layer 20 is removed, and more specifically, the filler layer 20 formed on a surface of the lining layer 16 is removed by a chemical metal polishing (CMP) process.

Figure 3G:
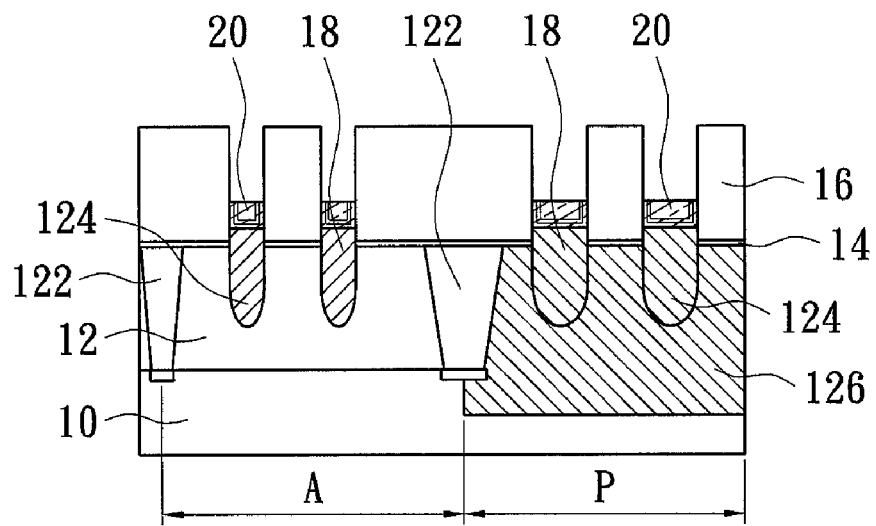

Immediately after the above step, an etch back process is used to remove a portion of the filler layer 20 in the recess trench channel 124 to expose a portion of the recess trench channel 124, and more specifically, a portion of the filler layer 20 is still remained in the recess trench channel 124, wherein the filler layers 20 are stacked and formed on the dielectric layer 18 (as shown in FIG. 3G).

Figure 3H:
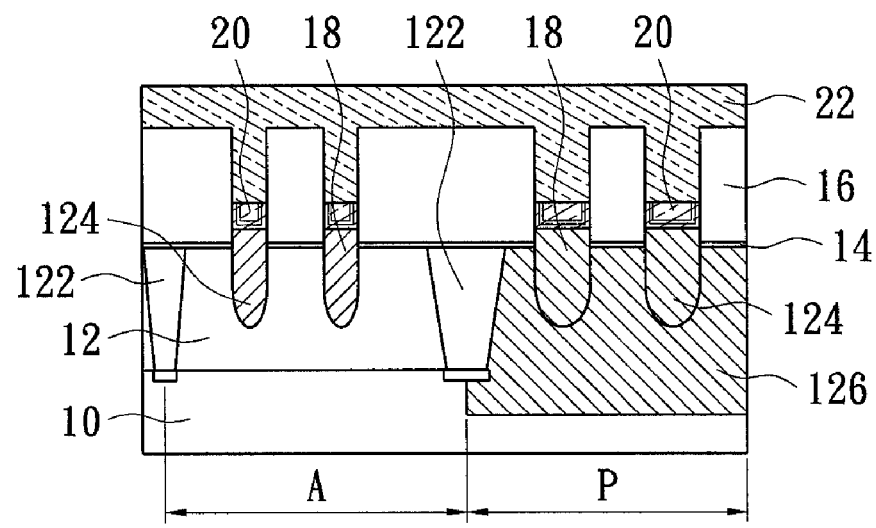

In Step (S117), after the dielectric layer 18 and the filler layer 20 are formed in the recess trench channel 124, a passivation layer 22 is formed and covered onto a surface of the lining layer 16, wherein the passivation layer 22 is formed on the surface of the lining layer 16 by a thin film deposition process and the deposited passivation layer 22 covers and fills up the recess trench channel 124 (as shown in FIG. 3H).

It is noteworthy to point out that the thin film deposition process is a physical vapor deposition (PVD) process or a chemical vapor deposition (CVD) process, and the passivation layer 22 is composed of silicon nitride (SiN).

Figure 3I:
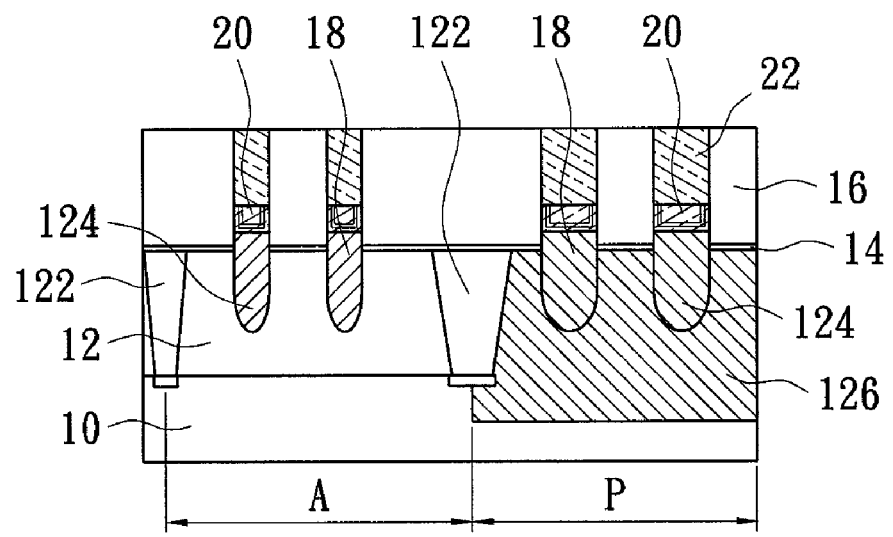

In Step (S118), after the passivation layer 22 fills up the recess trench channel 124, the passivation layer is planarized by a CMP process, and thus a portion of the passivation layer 22 is removed. More specifically, the passivation layer 22 formed on a surface of the lining layer 16 is removed, and the passivation layer 22 filled into the recess trench channel 124 is remained, such that the passivation layer 22 is stacked and formed on the filler layer 20 filled into the recess trench channel, and aligned substantially even with the lining layer 16 (as shown in FIG. 3I).

Figure 3J:
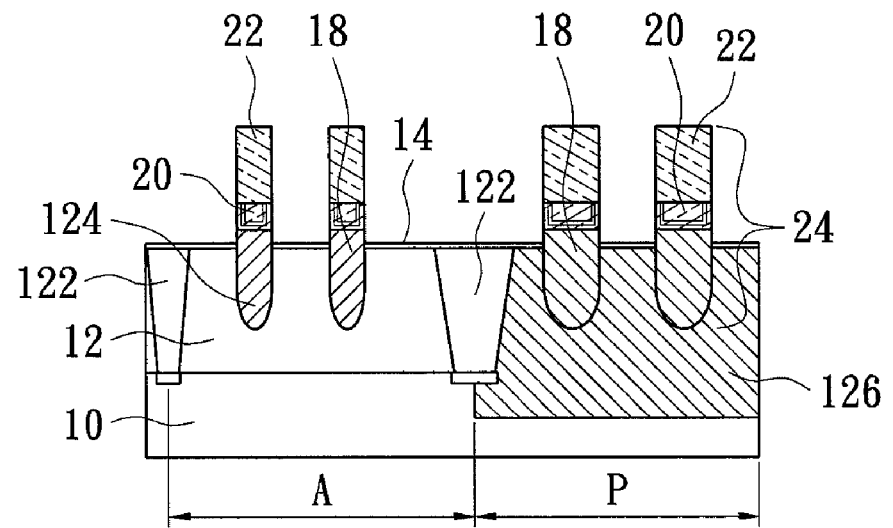

In Step (S119), the barrier layer 14 is used as a mask for removing the lining layer 16 formed on the target layer 12 by an etching process. In other words, the lining layer 16 formed on a surface of the barrier layer 14 is etched and removed, such that a plurality of structural monomers 24 are self-aligned at positions corresponding to the recess trench channels 124 and protruded from a surface of the target layer 12 (as shown in FIG. 3J). More specifically, the structural monomer 24 is formed by stacking the dielectric layer 18, the filler layer 20 and the passivation layer 22 sequentially.

It is noteworthy to point out that the etching process can be a dry etching process or a wet etching process.

In summation of the description above, the self-alignment method for a recess channel dynamic random access memory of the present invention has the following advantages: the process method of the present invention is simple and easy, and capable of avoiding problems caused by a mis-aligned etch, and thus the process of the present invention has a higher yield rate. In addition, the present invention is compatible with the present semiconductor process, and thus it is not necessary to develop any new material or process, and the present invention can overcome the mis-aligned problem as well as the cell-to-cell field leakage problem.

The above-mentioned descriptions represent merely the preferred embodiments of the present invention, without any intention to limit the scope of the present invention thereto. Various equivalent changes, alternations, or modifications based on the claims of the present invention are all consequently viewed as being embraced by the scope of the present invention.

What is claimed is:

1. A self-alignment method for a recess channel dynamic random access memory, in which said self-alignment method being applied in a manufacturing process of a stack dynamic random access memory, comprising the steps of:
    providing a substrate, wherein said substrate includes a target layer having a plurality of shallow trench isolation structures, a barrier layer and a lining layer sequentially formed on a surface of said substrate;
    patternizing said lining layer, said barrier layer and said target layer to form a plurality of recess trench channels penetrated through said lining layer and said barrier layer and extended into said target layer;
    forming a dielectric layer to cover and fill said recess trench channel;
    selectively forming an ion doped region onto said target layer;
    removing a portion of said dielectric layer to expose a portion of said recess trench channel;
    stacking a plurality of types of filling materials to form a filler layer to cover and fill said recess trench channel;
    removing a portion of said filler layer to expose a portion of said recess trench channel;
    forming a passivation layer to cover and fill said recess trench channel;
    removing said passivation layer formed on a surface of said lining layer; and
    removing said lining layer, and self-aligning a position corresponding to said recess trench channel to form a plurality of structural monomers disposed on and protruded from said target layer.

2. The self-alignment method for a recess channel dynamic random access memory as recited in claim 1, wherein said shallow trench isolation structure of said target layer is formed by a shallow trench isolation fabrication process.

3. The self-alignment method for a recess channel dynamic random access memory as recited in claim 1, wherein said recess trench channel is formed by patternizing a portion of said lining layer, a portion of said barrier layer and a portion of said target layer by an optical lithography process and an etching process.

4. The self-alignment method for a recess channel dynamic random access memory as recited in claim 1, wherein said recess trench channel is disposed between said shallow trench isolation structures.

5. The self-alignment method for a recess channel dynamic random access memory as recited in claim 1, wherein said lining layer is formed on said target layer by a thin film deposition process, and said thin film deposition process is a physical vapor deposition (PVD) process or a chemical vapor deposition (CVD) process.

6. The self-alignment method for a recess channel dynamic random access memory as recited in claim 5, wherein said lining layer is composed of an oxide material.

7. The self-alignment method for a recess channel dynamic random access memory as recited in claim 1, wherein said thin film deposition process is used for forming said dielectric layer on a surface of said lining layer to fill up said dielectric layer into said recess trench channel.

8. The self-alignment method for a recess channel dynamic random access memory as recited in claim 7, wherein said dielectric layer is composed of poly-silicon material.

9. The self-alignment method for a recess channel dynamic random access memory as recited in claim 1, wherein said ion doped region is formed by an ion-implant process to selectively penetrate ions through said dielectric layer, said lining layer and said barrier layer and implant the ions into said target layer, and said ion doped region is a p-well region or an n-well region.

10. The self-alignment method for a recess channel dynamic random access memory as recited in claim 9, wherein said ion is one selected from the group consisting of zinc ion ($Zn^{2+}$), fluorine ion ($F^-$), nitrogen ion ($N^-$), oxygen ion ($O^{2-}$), carbon ion ($C^{4+}$), argon ion ($Ar^+$), boron ion ($B^+$), phosphorus ion ($P^+$), arsenic ion ($As^+$) and antimony ion ($Sb^+$).

11. The self-alignment method for a recess channel dynamic random access memory as recited in claim 1, wherein said method of removing a portion of said dielectric layer to expose a portion of said recess trench channel comprises the steps of: removing said dielectric layer from the surface of said lining layer by a chemical metal polishing (CMP) process, and removing a portion of said dielectric layer in said recess trench channel by an etch back process to expose a portion of said recess trench channel.

12. The self-alignment method for a recess channel dynamic random access memory as recited in claim 1, wherein said filler layer is formed onto a surface of said lining layer by a thin film deposition process, and then said filler layer is filled up into said recess trench channel.

13. The self-alignment method for a recess channel dynamic random access memory as recited in claim 12, wherein said filler layer is formed by sequentially depositing at least three types of filling materials.

14. The self-alignment method for a recess channel dynamic random access memory as recited in claim 13, wherein said filling materials are sequentially titanium (Ti), tungsten nitride (WN) and tungsten (W).

15. The self-alignment method for a recess channel dynamic random access memory as recited in claim 1, wherein said method of removing a portion of said filler layer to expose a portion of said recess trench channel comprises the steps of: removing said filler layer from a surface of said lining layer by a CMP process and removing a portion of said filler layer in said recess trench channel by an etch back process to expose a portion of said recess trench channel.

16. The self-alignment method for a recess channel dynamic random access memory as recited in claim 1, wherein said passivation layer is formed on a surface of said lining layer by a thin film deposition process, and then said filler layer is filled up into said recess trench channel.

17. The self-alignment method for a recess channel dynamic random access memory as recited in claim 16, wherein said passivation layer is composed of silicon nitride (SiN).

18. The self-alignment method for a recess channel dynamic random access memory as recited in claim 16, wherein said passivation layer is removed from a surface of said lining layer by a chemical mechanical polishing (CMP) process.

19. The self-alignment method for a recess channel dynamic random access memory as recited in claim 1, wherein said lining layer formed onto a surface of said barrier layer is removed by an etching process, and said etching process is a dry etching process or a wet etching process.

20. The self-alignment method for a recess channel dynamic random access memory as recited in claim 1, wherein said structural monomer is formed sequentially by said dielectric layer, said filler layer and said passivation layer.

* * * * *